United States Patent
Omura et al.

(10) Patent No.: US 8,513,134 B2
(45) Date of Patent: Aug. 20, 2013

(54) SEMICONDUCTOR DEVICE PRODUCING METHOD

(75) Inventors: Mitsuhiro Omura, Kawasaki (JP); Yumi Ohno, Yokkaichi (JP); Takaya Matsushita, Yokkaichi (JP); Tokuhisa Ohiwa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/013,380

(22) Filed: Jan. 25, 2011

(65) Prior Publication Data

US 2012/0021605 A1 Jan. 26, 2012

(30) Foreign Application Priority Data

Jul. 21, 2010 (JP) .................................. 2010-163741

(51) Int. Cl.
*H01L 21/302* (2006.01)
(52) U.S. Cl.
USPC ........... 438/709; 438/710; 438/726; 438/730; 438/738; 257/E21.143; 257/E21.218
(58) Field of Classification Search
USPC .................. 438/14, 709, 710, 726, 730, 738; 257/E21.143, E21.218
See application file for complete search history.

(56) References Cited

U.S. PATENT DOCUMENTS

| 7,473,377 | B2 | 1/2009 | Yamaguchi et al. | |
|---|---|---|---|---|
| 8,105,949 | B2 | 1/2012 | Honda et al. | |
| 2005/0103748 | A1 | 5/2005 | Yamaguchi et al. | |
| 2010/0009542 | A1 | 1/2010 | Honda et al. | |
| 2010/0144155 | A1* | 6/2010 | Yatsuda et al. | 438/700 |
| 2011/0124134 | A1* | 5/2011 | Lin et al. | 438/14 |
| 2012/0094495 | A1 | 4/2012 | Honda et al. | |

FOREIGN PATENT DOCUMENTS

| JP | 5-152255 | 6/1993 |
|---|---|---|
| JP | 3450253 | 7/2003 |
| JP | 2006-108484 | 4/2006 |
| JP | 2008-198988 | 8/2008 |
| WO | WO 2007/116964 A1 | 10/2007 |

OTHER PUBLICATIONS

Notification of Reason for Rejection issued by the Japanese Patent Office on May 10, 2013, for Japanese Patent Application No. 2010-163741, and English-language translation thereof.

* cited by examiner

*Primary Examiner* — Minchul Yang
(74) *Attorney, Agent, or Firm* — Finnegan, Henderson, Farabow, Garrett & Dunner, L.L.P.

(57) ABSTRACT

In a semiconductor device producing method according to one embodiment, an insulating film containing silicon is formed on a semiconductor substrate, a resist is deposited on the insulating film, the resist is patterned into a predetermined pattern, and the insulating film is processed by a dry etching treatment in which gas containing C, F, Br, H, and O is used with the resist having the predetermined pattern as a mask. A deposited film in which C and Br are coupled is produced on the resist.

17 Claims, 5 Drawing Sheets

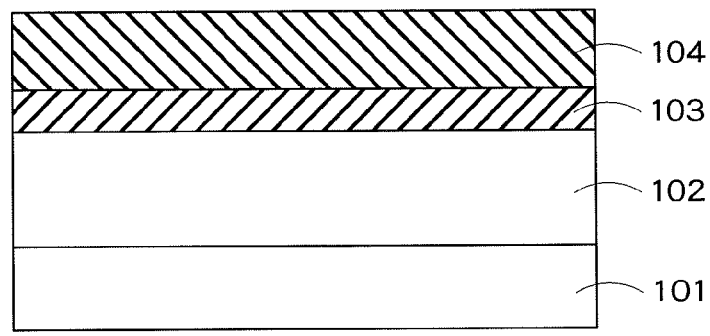
F I G. 1
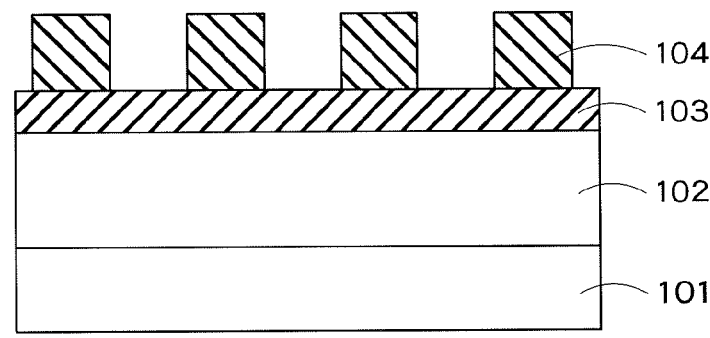
F I G. 2
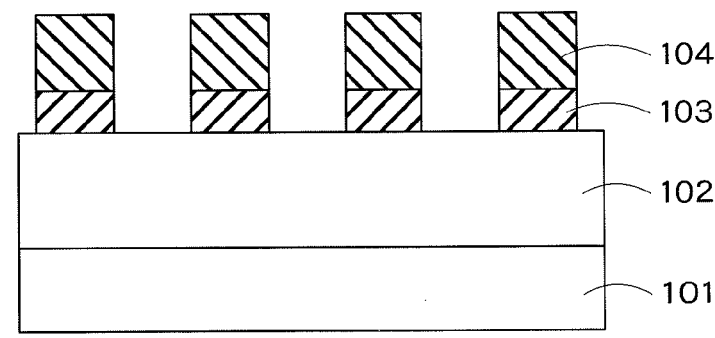
F I G. 3

(atomic%)

|  | C | Br | F | N | O |
|---|---|---|---|---|---|
| CHF$_3$/HBr/O$_2$ =50/50/10[sccm] | 56.8 | 3.5 | 28.8 | 2.2 | 8.5 |

SEMICONDUCTOR DEVICE PRODUCING METHOD

CROSS REFERENCE TO RELATED APPLICATION

This application is based upon and claims benefit of priority from the Japanese Patent Application No. 2010-163741, filed on Jul. 21, 2010, the entire contents of which are incorporated herein by reference.

FIELD

Embodiments described herein relate generally to a semiconductor device producing method.

BACKGROUND

Recently, with high integration and high performance of a semiconductor device, mainstream of an exposure technique has been changed from use of a KrF (krypton fluoride) excimer laser to use of an ArF (argon fluoride) excimer laser, and immersion exposure and EUV (Extreme Ultraviolet) exposure also have been discussed.

A resist material is also changed in association with the change of the light source, and a dry etching resistance property of the resist material constituting a mask is degraded. Therefore, resist collapse (resist degradation) is generated during dry etching, and morphology is roughened to roughen an edge of a transferred underlying pattern. In forming a line and space pattern, values of LER (Line Edge Roughness) and LWR (Line Width Roughness) are increased to cause a variation in threshold voltage of a transistor or degradation of reliability of an interconnection, which results in a problem in that device characteristics are degraded.

As described above, in the recent semiconductor device, the degradation of the dry etching resistance property of the resist material constituting the mask becomes a large problem with generation change of a lithography technique due to a finer design rule. This influences the degradation of the LER and LWR of the line and space pattern and a deformation of a hole pattern shape, and the characteristics and yield of the actual device are degraded. Therefore, it is necessary to improve the degraded characteristics and yield of the device.

BRIEF DESCRIPTION OF THE DRAWINGS

FIG. 1 is a process sectional view for explaining a semiconductor device producing method according to an embodiment of the invention;

FIG. 2 is a process sectional view subsequent to FIG. 1;

FIG. 3 is a process sectional view subsequent to FIG. 2;

DETAILED DESCRIPTION

Hereafter, a semiconductor device producing method according to the present invention will be described more specifically with reference to the drawings.

In a semiconductor device producing method according to one embodiment, an insulating film containing silicon is formed on a semiconductor substrate, a resist is deposited on the insulating film, the resist is patterned into a predetermined pattern, and the insulating film is processed by a dry etching treatment in which gas containing C, F, Br, H, and O is used with the resist having the predetermined pattern as a mask. A deposited film in which C and Br are coupled is produced on the resist.

In order to improve the variations in characteristics such as LER and LWR in the semiconductor device, it is necessary to suppress the resist collapse during the dry etching. In the semiconductor device producing method of the embodiment, in order to solve the problem, the dry etching is realized without generating the resist collapse by performing the dry etching treatment in which gas containing C, F, Br, H, and O is used during processing of the silicon oxide film with the resist as the mask. The embodiment of the invention will be described below with reference to the drawings.

Figure 4:
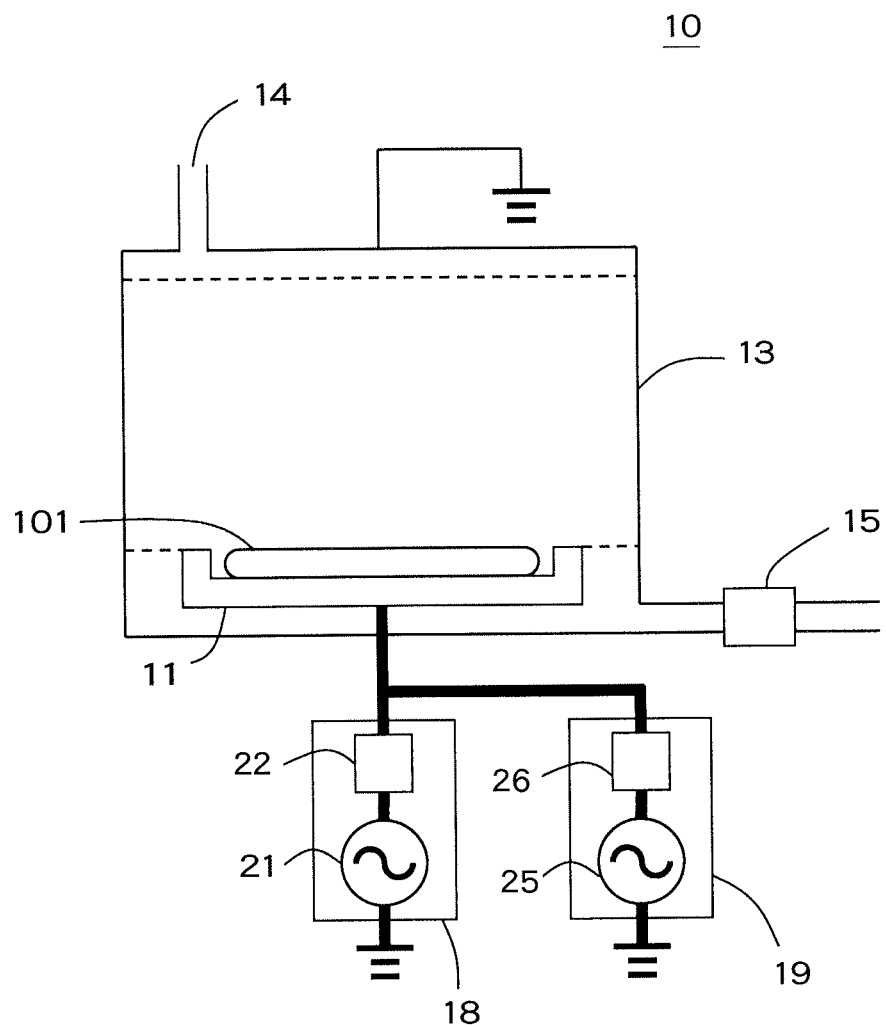
FIG. 4 is a schematic configuration diagram of a dry etching apparatus.

The semiconductor device producing method will be described with reference to FIGS. 1 to 4. FIGS. 1 to 3 are process sectional views, and FIG. 4 is a schematic configuration diagram of a dry etching apparatus that is used in a dry etching treatment.

As illustrated in FIG. 1, a processed film 102 is formed on a semiconductor substrate 101. The processed film 102 may have a stacked-layer structure in which plural films are stacked.

A silicon oxide film 103 having a thickness of about 100 nm is deposited as a hard mask material on the processed film 102 by a Chemical Vapor Deposition (CVD) method.

Then, a resist 104 of about 200 nm is applied onto the silicon oxide film 103. For example, the resist 104 is an ArF exposure resist.

As illustrated in FIG. 2, the resist 104 is patterned into a predetermined pattern using a lithography technique. At this point, exposure is performed to the resist 104 using an ArF excimer laser. For example, the resist 104 is processed into a line and space pattern having a half pitch of about 50 nm.

As illustrated in FIG. 3, the silicon oxide film 103 is processed by a dry etching treatment with the resist 104 patterned into the line and space pattern as a mask. At this point, a dry etching apparatus 10 illustrated in FIG. 4 is used in the dry etching treatment.

FIG. 4 illustrates a schematic configuration of the dry etching apparatus 10. The dry etching apparatus 10 includes a high-frequency electrode (hereinafter referred to as an "RF electrode) 11 on which the semiconductor substrate 101 is placed, a chamber 13 that retains a vacuum state, a gas supply port 14 that supplies gas necessary to generate plasma to the inside of the chamber 13, and a pressure reduction pump 15 that reduces a pressure in the chamber 13.

Gas in which tri-fluoromethane ($CHF_3$), hydrogen bromide (HBr), and oxygen ($O_2$) are mixed is supplied to the chamber 13 through the gas supply port 14. For example, the gas has a mixed ratio of $CHF_3:HBr:O_2=50:50:10$.

The inside of the chamber 13 can be reduced in a desired treatment atmosphere, for example, in a pressure of about 1 Pa to about 100 Pa.

In order to perform the etching treatment by generating plasma of the gas supplied to the chamber 13, the dry etching apparatus 10 includes a first power-supply unit 18 and a second power-supply unit 19, which apply high-frequency powers to the RF electrode 11.

Although the detailed structure of the RF electrode 11 is not illustrated in FIG. 4, for example, the RF electrode 11 includes an electrostatic chuck that sucks and retains the semiconductor substrate 101 and a metallic stage that supports the electrostatic chuck, and the high-frequency power is applied to the metallic stage.

The first power-supply unit 18 applies the high-frequency power to the RF electrode 11 in order to control a self-bias voltage on the RF electrode 11, that is, a self-bias voltage generated in the semiconductor substrate 101 retained by the RF electrode 11. The first power-supply unit 18 includes a first power supply 21 that outputs the high-frequency power having a first frequency and a first matching box 22 that performs impedance matching to a plasma load.

The second power-supply unit 19 applies the high-frequency power to the RF electrode 11 in order to mainly generate and maintain the plasma. The second power-supply unit 19 includes a second power supply 25 that outputs the high-frequency power having a second frequency and a second matching box 26.

The plasma is generated when the high-frequency power having the first frequency, output from the first power-supply unit 18, and the high-frequency power having the second frequency, output from the second power-supply unit 19, are applied to the RF electrode 11 in a superimposed manner. Electron density of the plasma depends on a high-frequency component of the second frequency that is applied from the second power-supply unit 19 to the RF electrode 11.

In the embodiment, the first power-supply unit 18 applies the high-frequency power of about 300 W to the RF electrode 11 at a frequency of 13.56 MHz, and the second power-supply unit 19 applies the high-frequency power of about 1000 W to the RF electrode 11 at a frequency of 100 MHz. A $CHF_3$ gas, a HBr gas, and an $O_2$ gas are passed at 50 sccm, 50 sccm, and 10 sccm through the gas supply port 14 to set the pressure in the chamber 13 to about 4 Pa. The dry etching is performed to the silicon oxide film 103 under the above-described conditions.

Figure 5:
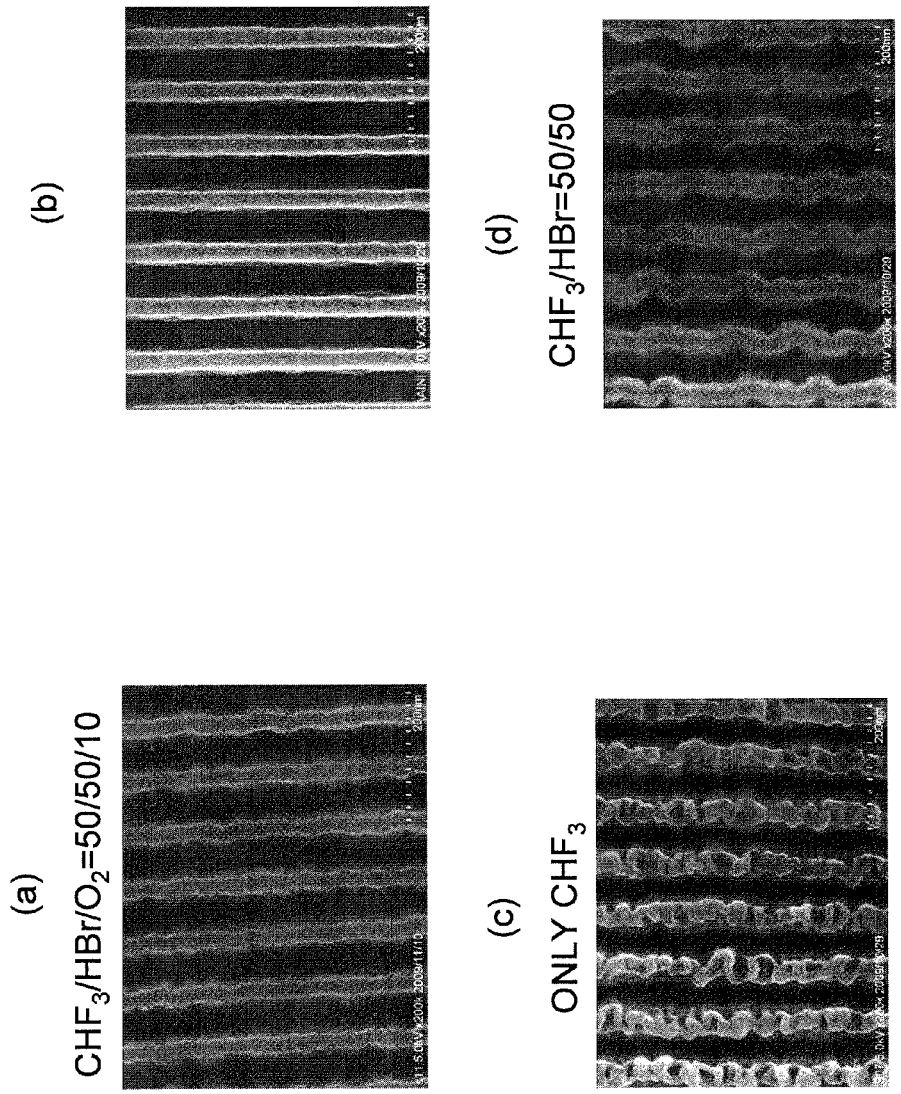
FIG. 5 is a view illustrating SEM images of resist surfaces.

FIG. 5(a) illustrates a SEM (Scanning Electron Microscope) photograph of a surface of the resist 104 after the silicon oxide film 103 is processed. For the purpose of comparison, FIG. 5(b) illustrates a SEM photograph of the surface of the resist 104 immediately after the patterning is performed using the lithography technique of FIG. 2.

FIG. 5(c) illustrates a SEM photograph of the surface of the resist 104 as a comparative example (related art) after the silicon oxide film 103 is processed when the gas of only $CHF_3$ is supplied through the gas supply port 14. FIG. 5(d) illustrates a SEM photograph of the surface of the resist 104 after the silicon oxide film 103 is processed when the gas only containing $CHF_3$ and HBr (the flow ratios are set to 50/50 [sccm]) is supplied through the gas supply port 14.

The resist collapse is generated in FIG. 5(c), while the resist collapse is prevented in FIG. 5(a).

The resist collapse generated in FIG. 5(c) is attributed to the following fact.

When the plasma of the gas containing $CHF_3$ is generated, an ion and a radical containing highly reactive F are produced, and the resist 104 is irradiated with the ion and radical to replace H and F in the resist 104, thereby expanding a volume of the resist 104 to generate an abnormal shape.

When the plasma of the gas containing $CHF_3$ and HBr is generated, a deposition containing C, F, Br, and H is produced on the surface of the resist 104, and the surface of the resist 104 is covered with the deposition, thereby suppressing a reaction between the resist 104 and ion and radical containing the highly reactive F. Therefore, although the surface of the line pattern is smoothed, the line pattern meanders largely as illustrated in FIG. 5(d). This is attributed to a stress possessed by the deposition containing C, F, Br, and H.

Figures 6, 7:
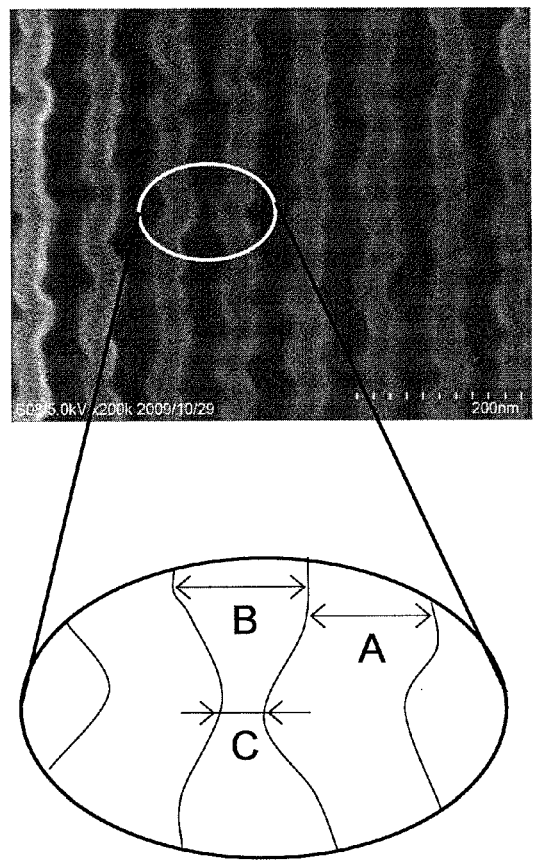
FIG. 6 is a partially enlarged view schematically illustrating a line and space pattern.
FIG. 7 illustrates an element composition ratio of a deposition.

FIG. 6 illustrates measurement result of a size of a part of the line and space pattern illustrated in FIG. 5(d). A line portion A had the size of 38 nm, a space portion B had the size of 47 nm, and a space portion C had the 14 nm. The line pattern is finally transferred to the processed film 102 constituting, for example, a gate electrode. A short-circuit defect is rarely generated at a point, such as the space portion B, at which the space portion B is larger than the line portion A in size. On the other hand, the short-circuit defect is probably generated at a point, such as the space portion C, at which the space portion C becomes a half or less of the line portion B in size. This leads to a decrease in yield of the semiconductor device. Desirably, the smallest size is at least a half of the usual space size in the space portion of the resist 104 after the dry etching treatment.

Therefore, in the embodiment, the amount of deposition containing C, F, Br, and H is controlled so as to be minimized on the resist surface using the gas in which $O_2$ is further added to $CHF_3$ and HBr, so that the resist collapse can be suppressed while the stress caused by the deposition is reduced to suppress the meandering of the line pattern as illustrated in FIG. 5(a). As is clear from FIG. 5(a), the smallest size is at least a half of the usual space size. Thus, it is necessary that the elements C, F, Br, H, and O be contained in the etching gas.

In order to check a composition of the deposition deposited on the resist, an XPS (X-ray Photoelectron Spectroscopy) analysis of the resist surface was performed by the exposing as-prepared resist film to the dry etching using a mixed gas of $CHF_3$/HBr/$O_2$=50/50/10 [sccm]. FIG. 7 illustrates an element composition ratio obtained from the XPS analysis, and it is found that C, Br, F, N, and O are contained in the deposition on the resist surface. It is believed that the resist mainly contains C before the treatment. Therefore, F and Br are supplied from the etching gas. At this point, 3.5 atomic percent Br is detected. In consideration of the improvement of the resist collapse in the gas system containing HBr, it is necessary that at least several percent Br exist in the deposition. It is believed that the detected O and N are contained in the resist.

Figure 8:
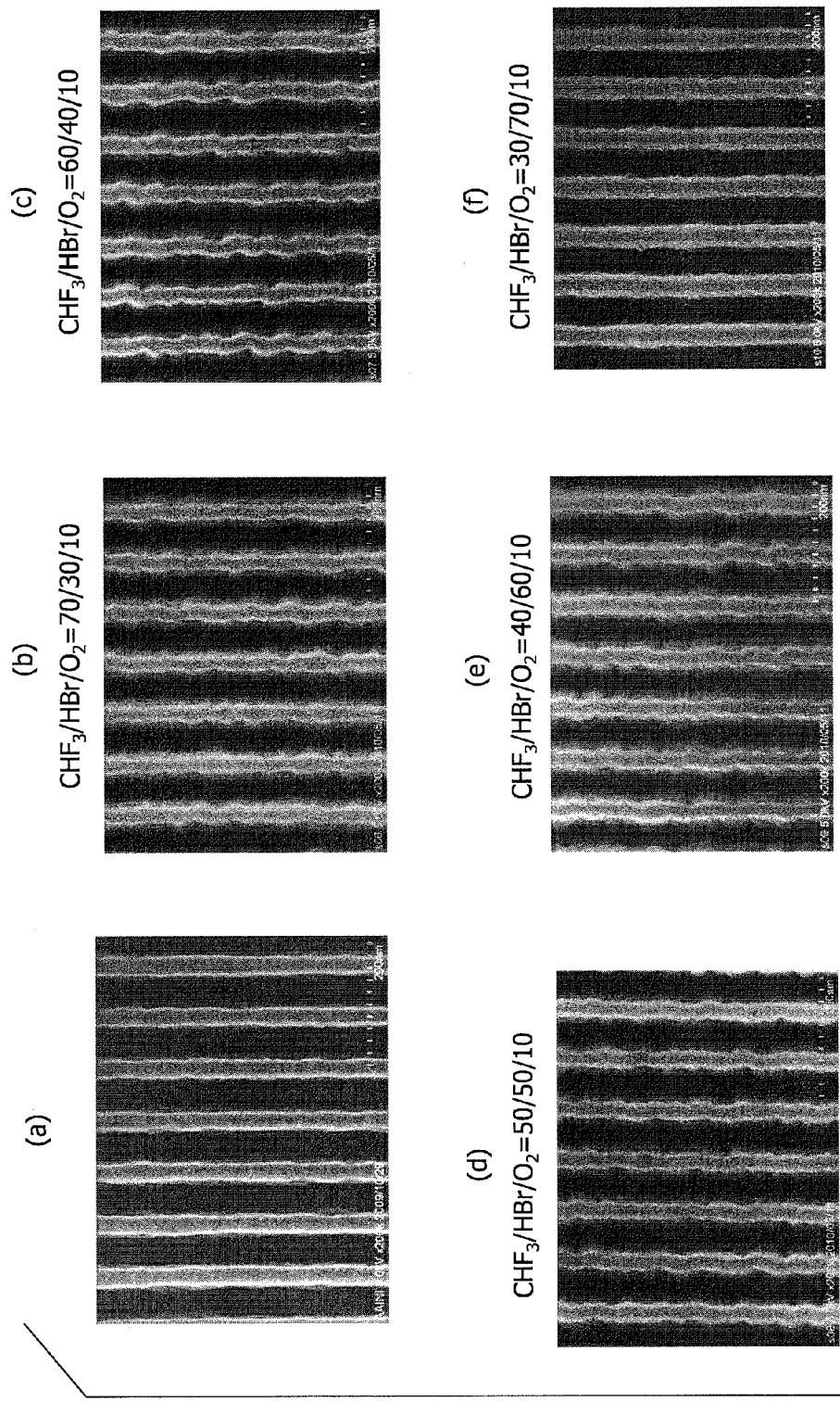
FIG. 8 is a view illustrating SEM images of resist surfaces.

FIG. 8 illustrates a SEM photograph of the surface of the resist 104 after the silicon oxide film 103 is processed when a gas flow ratio of $CHF_3$ and HBr is changed in the gas of $CHF_3$/HBr/$O_2$. FIG. 8(a) illustrates a SEM photograph of the surface of the resist 104 immediately after the patterning is performed using the lithography technique for the purpose of comparison, and FIG. 8(a) is similar to FIG. 5(b).

FIG. 8(b) illustrates the case in which the gas flow ratio of $CHF_3$/HBr/$O_2$ is 70/30/10 [sccm]. FIG. 8(c) illustrates the case in which the gas flow ratio of $CHF_3$/HBr/$O_2$ is 60/40/10 [sccm]. FIG. 8(d) illustrates the case in which the gas flow ratio of $CHF_3$/HBr/$O_2$ is 50/50/10 [sccm], and FIG. 8(d) is identical to FIG. 5(a). FIG. 8(e) illustrates the case in which the gas flow ratio of $CHF_3$/HBr/$O_2$ is 40/60/10 [sccm]. FIG. 8(f) illustrates the case in which the gas flow ratio of $CHF_3$/HBr/$O_2$ is 30/70/10 [sccm].

As can be seen from FIGS. 8(b), 8(c), and 8(e), the resist collapse is improved at the substantially same level as FIG. 8(d). The resist collapse is further improved in the case of FIG. 8(f) in which the gas flow ratio of $CNF_3$/HBr/$O_2$ is set to 30/70/10 [sccm] such that HBr becomes rich. This is attributed to the fact that the resist is more strongly covered with the deposition richly containing H and Br to suppress the resist collapse. Accordingly, in the ternary gas system of $CHF_3$, HBr, and $O_2$, the resist collapse can largely be suppressed by setting the ratio of $CHF_3$/HBr to 3/7 or less.

Because the element ratio in the mixed gas becomes C/H/F/Br/O=10/32/29/23/6 [%] when the gas flow ratio of $CHF_3$/

HBr/O$_2$ is set to 30/70/10 [sccm], it is also said that the resist collapse can largely be suppressed by setting the ratio of H and Br to 3:7 or more.

Because the resist collapse is effectively suppressed by increasing the ratio of HBr, it is also necessary to control the ratio of H. That is, it is believed that H contained in CHF$_3$ also plays a considerable role. The deposition is easily generated in the higher ratio of H for the comparison of dry etching characteristics of the gases such as tetra-fluoromethane (CF$_4$), CHF$_3$, di-fluoromethane (CH$_2$F$_2$), mono-fluoromethane (CH$_3$F), and methane (CH$_4$). This is because the ratio of the F radical removing the deposition is decreased or the F radical is scavenged from the plasma by H. Accordingly, the gas in which both H and F are coupled to C is effectively used when the deposition is produced to protect the resist surface.

According to the embodiment, the suppression of the resist collapse can transfer the desired pattern to the silicon oxide film 103. The processed film 102 can be processed into the desired pattern with the silicon oxide film 103 as a hard mask. Accordingly, for example, when a transistor is processed, a variation in threshold voltage of the transistor can be suppressed. The decrease in yield of an interconnection or the decrease in reliability can be prevented in processing an interconnection pattern.

As described above, according to the embodiment, the degradation of the characteristic of the semiconductor device can be prevented.

In the embodiment, the silicon oxide film is formed as the hard mask material below the resist 104 by way of example. Any insulating film such as a silicon nitride film and a silicon oxy-nitride film may be used as the silicon oxide film as long as the silicon-containing insulating film can be processed using the gas in which CHF$_3$, HBr, and O$_2$ are mixed.

In the embodiment, it is necessary that the gases etching the deposition containing C, F, Br, and H be mixed to adjust the deposition amount while the plasma containing C (carbon), F (fluorine), Br (bromine), and H (hydrogen) is generated. For example, CHF$_3$, CH$_2$F$_2$, and CH$_3$F can be used as the gas containing C, F, and H. O$_2$, nitrogen (N$_2$), carbon monoxide (CO), carbon dioxide (CO$_2$), hydrogen (H$_2$), and ammonia (NH$_3$) or rare gases such as argon (Ar), helium (He), and xenon (Xe) can be used as the gas that etches the deposition to adjust the deposition amount. Obviously, the gas in which F, Br, and H are directly coupled to C can be used, and O (oxygen) may also be coupled to C.

In the embodiment, capacitive coupled plasma, which is generated by superimposing the powers having the frequencies of 100 MHz and 13.56 MHz, is used as the plasma used in the dry etching. It is believed that the 100-MHz high-frequency power decomposes the CHF$_3$ and HBr into suitable states to evenly deposit the deposition containing C, F, Br, and H on the resist. In the embodiment, the second power-supply unit 19 applies the 100-MHz high-frequency power to the RF electrode 11. The similar effect is obtained when the second power-supply unit 19 applies the power having the high frequency more than 100 MHz.

It is noted that the resist collapse can be suppressed although the 13.56-MHz power supply that produces the bias to draw the ion applies the power of 300 W in order to process the silicon insulating film.

In the embodiment, not only the KrF resist and ArF resist but also a resist material that is easily altered by halogen or the ion may be used as the resist 104. The embodiment can also be applied to an EUV exposure resist and a nanoimprint resist material.

In the embodiment, the resist 104 is processed into the line and space pattern by way of example. The resist 104 may includes other patterns such as a hole shape.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device producing method comprising:
    forming an insulating film containing silicon on a semiconductor substrate;
    depositing a photo-sensitive resist layer, containing H, on the insulating film;
    forming a predetermined pattern in the resist layer by exposing the resist layer with light;
    processing the insulating film by a dry etching treatment in which a plasma of gas containing C, F, Br, H, and O is used with the exposed resist layer as a mask; and
    producing a deposited film in which C and Br are coupled on the exposed resist layer, wherein at least 3.5 atomic percent Br is contained in the deposited film in which C and Br are coupled.

2. The semiconductor device producing method according to claim 1, wherein a ratio of a Br element in the gas is 23% or more, and a ratio of an H element is 32% or more.

3. The semiconductor device producing method according to claim 1, wherein the gas contains at least HBr and gas in which H and F are coupled to C.

4. The semiconductor device producing method according to claim 3, wherein the gas is a mixed gas of CHF$_3$, HBr, and O$_2$.

5. The semiconductor device producing method according to claim 4, wherein a ratio of CHF$_3$/HBr in the gas is 3/7 or less.

6. The semiconductor device producing method according to claim 1, wherein the predetermined pattern includes a line and space pattern.

7. The semiconductor device producing method according to claim 1, wherein the insulating film is a silicon oxide film.

8. The semiconductor device producing method according to claim 1, wherein the insulating film is processed by the dry etching treatment to form a hard mask.

9. A semiconductor device producing method comprising:
    forming an insulating film containing silicon on a semiconductor substrate;
    depositing a photo-sensitive resist layer, containing H, on the insulating film;
    forming a predetermined pattern in the resist layer by exposing the resist layer with light;
    processing the insulating film by a dry etching treatment in which a plasma of gas containing C, F, Br, H, and O is used with the exposed resist layer as a mask; and
    producing a deposited film in which C and Br are coupled on exposed resist layer, wherein at least 3.5 atomic percent Br is contained in the deposited film in which C and Br are coupled, and wherein
    plasma of the gas is generated by applying a high-frequency power having a first frequency, output from a first power-supply unit, and a high-frequency power having a second frequency, output from a second power-supply unit, to the gas in a superimposed manner in the dry etching treatment, and one of the first frequency and the second frequency is 100 MHz or more.

10. The semiconductor device producing method according to claim 9, wherein a ratio of a Br element in the gas is 23% or more, and a ratio of an H element is 32% or more.

11. The semiconductor device producing method according to claim 9, wherein the gas contains at least HBr and gas in which H and F are coupled to C.

12. The semiconductor device producing method according to claim 11, wherein the gas is a mixed gas of $CHF_3$, HBr, and $O_2$.

13. The semiconductor device producing method according to claim 12, wherein a ratio of $CHF_3$/HBr in the gas is 3/7 or less.

14. The semiconductor device producing method according to claim 9, wherein the predetermined pattern includes a line and space pattern.

15. The semiconductor device producing method according to claim 9, wherein the insulating film is a silicon oxide film.

16. The semiconductor device producing method according to claim 9, wherein a bias voltage is generated with one of the first power-supply unit and the second power-supply unit in the dry etching treatment.

17. The semiconductor device producing method according to claim 9, wherein the insulating film is processed by the dry etching treatment to form a hard mask.

* * * * *